（12）United States Patent
Lu et al.

(10) Patent No.: US 11,018,154 B2
(45) Date of Patent: May 25, 2021

(54) MEMORY DEVICE AND METHOD FOR FABRICATING THE SAME

(71) Applicant: MACRONIX INTERNATIONAL CO., LTD., Hsinchu (TW)

(72) Inventors: Chun-Chang Lu, Yunlin County (TW); Wen-Jer Tsai, Hualien (TW); Guan-Wei Wu, Zhubei (TW); Yao-Wen Chang, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/543,688

(22) Filed: Aug. 19, 2019

(65) Prior Publication Data

US 2021/0057432 A1 Feb. 25, 2021

(51) Int. Cl.
*H01L 27/11582* (2017.01)
*H01L 29/36* (2006.01)
(Continued)

(52) U.S. Cl.
CPC .. *H01L 27/11582* (2013.01); *H01L 21/02636* (2013.01); *H01L 21/26513* (2013.01);
(Continued)

(58) Field of Classification Search
CPC ......... H01L 27/11568; H01L 27/11578; H01L 27/11582; H01L 29/40117; H01L 29/1037; H01L 29/36; H01L 29/792; H01L 29/7926; G11C 16/0466; G11C 16/0475; G11C 16/0483
See application file for complete search history.

(56) References Cited

U.S. PATENT DOCUMENTS

2015/0097222 A1* 4/2015 Lee .................... H01L 27/1157
257/314
2016/0329101 A1* 11/2016 Sakakibara ........ G11C 16/0483
(Continued)

FOREIGN PATENT DOCUMENTS

TW          201705451 A     2/2017
TW          I643317 B      12/2018
(Continued)

OTHER PUBLICATIONS

TW Office Action dated Jan. 21, 2020 in Taiwan application (No. 108129510).

*Primary Examiner* — Scott B Geyer
(74) *Attorney, Agent, or Firm* — McClure, Qualey & Rodack, LLP

(57) ABSTRACT

A memory device includes a conductive strip stack structure having conductive strips and insulating layers stacked in a staggered manner and a channel opening passing through the conductive strips and the insulating layer; a memory layer disposed in the channel opening and overlying the conductive strips; a channel layer overlying the memory layer; a semiconductor pad extending upwards from a bottom of the channel opening beyond an upper surface of a bottom conductive strip, in contact with the channel layer, and electrically isolated from the conductive strips; wherein the channel layer includes a first portion having a first doping concentration and a second portion having a second doping concentration disposed on the first portion.

10 Claims, 12 Drawing Sheets

(51) Int. Cl.
  *H01L 29/10*    (2006.01)
  *H01L 23/528*   (2006.01)
  *H01L 21/265*   (2006.01)
  *H01L 21/02*    (2006.01)
  *H01L 21/28*    (2006.01)
  *H01L 29/51*    (2006.01)

(52) U.S. Cl.
  CPC ........ *H01L 23/528* (2013.01); *H01L 29/1037* (2013.01); *H01L 29/36* (2013.01); *H01L 29/40117* (2019.08); *H01L 29/513* (2013.01)

(56) References Cited

U.S. PATENT DOCUMENTS

| | | | |
|---|---|---|---|
| 2017/0025421 A1* | 1/2017 | Sakakibara | H01L 29/40117 |
| 2018/0233513 A1* | 8/2018 | Zhang | G11C 16/08 |
| 2018/0269277 A1* | 9/2018 | Miyagawa | H01L 29/36 |
| 2019/0027489 A1* | 1/2019 | Orimoto | H01L 27/11582 |
| 2019/0067475 A1* | 2/2019 | Liu | H01L 21/44 |
| 2019/0312050 A1 | 10/2019 | Lai et al. | |
| 2019/0319100 A1* | 10/2019 | Chen | H01L 21/02532 |
| 2020/0119030 A1* | 4/2020 | Dasgupta | H01L 21/0254 |
| 2020/0185405 A1* | 6/2020 | Cui | H01L 29/40117 |

FOREIGN PATENT DOCUMENTS

| | | |
|---|---|---|
| TW | I663715 B | 6/2019 |
| TW | I667741 B | 8/2019 |

\* cited by examiner

MEMORY DEVICE AND METHOD FOR FABRICATING THE SAME

BACKGROUND OF THE INVENTION

Field of the Invention

The invention relates in general to a memory device and the method for fabricating the same, and more particularly to a three-dimensional (3D) memory device having multiple planes of memory cells and the method for fabricating the same.

Description of the Related Art

As critical dimensions of devices in integrated circuits shrink to the limits of common memory cell technologies, designers have been looking for techniques to stack multiple planes of memory cells to achieve greater storage capacity, and to achieve lower costs per bit. The charge trapping memory technology, using silicon-oxide-nitride-oxide-silicon SONOS charge trapping structure, has been applied to form a memory device having a vertical channel structure, such as a 3D NAND flash memory device. The vertical channel structure includes an ONO charge trapping layer passing through a stack of conductive strips and a channel layer disposed on the ONO charge trapping layer. The memory cells are formed at interface regions between the conductive strips, the ONO charge trapping layer and the channel layer, and electrically connected in series by the channel layer to form a memory cells string.

However, the channel layer of a typical vertical channel structure is generally composed of a deposited semiconductor material; such as an epitaxial poly-silicon, in which grain boundaries (GBs) may be easily generated. Due to the influence of the grain boundaries in the channel layer; the threshold voltages of the string selection switch, the ground selection switch and the memory cells in the memory cell string may vary. In particular, when the grain boundary is generated in a non-gate-control region, the position of the channel layer where is disposed between the ground selection switch and the memory cell string, the current of the channel can be greatly reduced, and the threshold voltage of the memory cell can be increased, whereby the stability of the memory cell operation (such as writing, erasing the verified operation) may be deteriorated.

Therefore, there is a need of providing an advanced memory device and the method for fabricating the same to obviate the drawbacks encountered from the prior art.

SUMMARY OF THE INVENTION

According to one aspect of the present disclosure, a memory device is provided, wherein the memory device includes a conductive strip stack structure, a memory layer, a channel layer and a doped semiconductor pad. The conductive strip stack structure includes a plurality of conductive strips and a plurality of insulating layers stacked in a staggered manner with the conductive strips. The conductive strip stack structure also has at least one channel opening passing through the conductive strips and the insulating layer. The memory layer is disposed in the channel opening and overlies the portions of the conductive strips that are exposed from the channel opening. The channel layer is disposed in the channel opening and overlies the memory layer. The doped semiconductor pad extends upwards from the bottom of the channel opening beyond the upper surface of a bottom conductive strip in the plurality of conductive strips, and is in contact with the channel layer, and is electrically isolated from the conductive strips. The channel layer includes a first portion having a first doping concentration and a second portion having a second doping concentration disposed on the first portion.

According to another aspect of the present disclosure, a method for fabricating a memory device is provided, wherein the method includes steps as follows: A conductive strip stack structure having at least one channel opening is provided, wherein the conductive strip stack structure includes a plurality of conductive strips and a plurality of insulating layers stacked in a staggered manner with the conductive strips; and the channel opening passes through the conductive strips and the insulating layer. A semiconductor pad extending upwards from the bottom of the channel opening beyond the upper surface of a bottom conductive strip in the plurality of conductive strips is formed, wherein the semiconductor pad is electrically isolated from the conductive strips. Implanting a base dopant into the semiconductor pad. A memory layer is formed in the channel opening to overlying the portion of the conductive strips that is exposed through the channel opening. A channel layer is formed in the channel opening overlying the memory layer and in contact with the semiconductor pad. A portion of the base dopant is driven into the channel layer to make the channel layer includes a first portion having a first doping concentration and a second portion having a second doping concentration disposed on the first portion.

According to the above embodiments, a memory device and a method of fabricating the same are provided, in which a semiconductor pad is formed on the bottom of a channel opening for forming a vertical memory cell string and in contact with the channel layer of the vertical memory cell string subsequently formed on the sidewall of the channel opening. Before forming the channel layer, a base dopant is implanted into the semiconductor pad by an ion implantation process, and a part of the base dopant in the semiconductor pad is driven into the vertical channel layer by heat treatments of the subsequent process, thereby the resistance of the channel layer can be reduced, and a stable threshold voltage control can be provided for the vertical memory cell string. Such that, the conventional problem of unstable operation due to a grain boundary generated in the non-gate control region of the channel layer can be solved.

BRIEF DESCRIPTION OF THE DRAWINGS

The above and other aspects of the disclosure will become better understood with regard to the following detailed description of the preferred but non-limiting embodiment(s), The following description is made with reference to the accompanying drawings.

DETAILED DESCRIPTION OF THE INVENTION

Figure 1A:
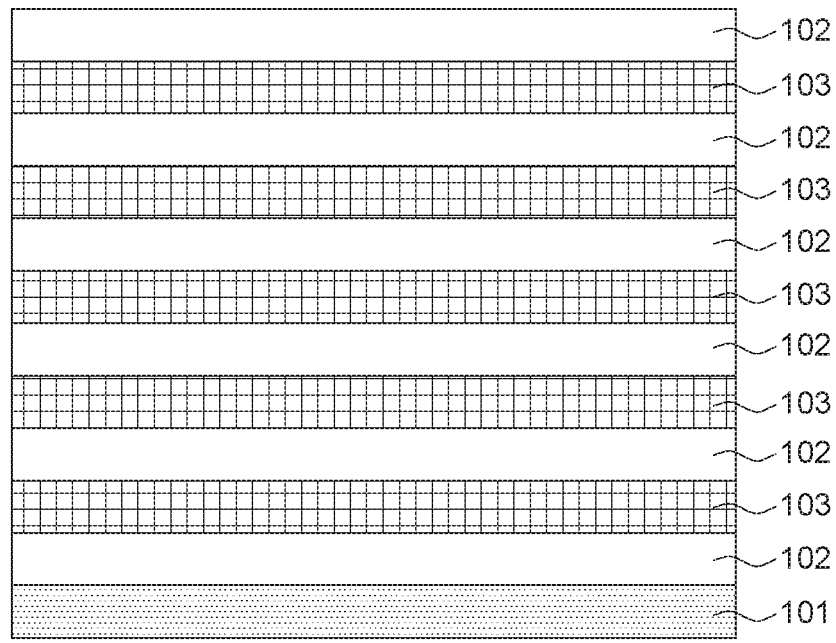
FIGS. 1A to 1G are cross-sectional views illustrating the processing structures for fabricating a memory device, in accordance with one embodiment of the present disclosure.
Figure 1B:
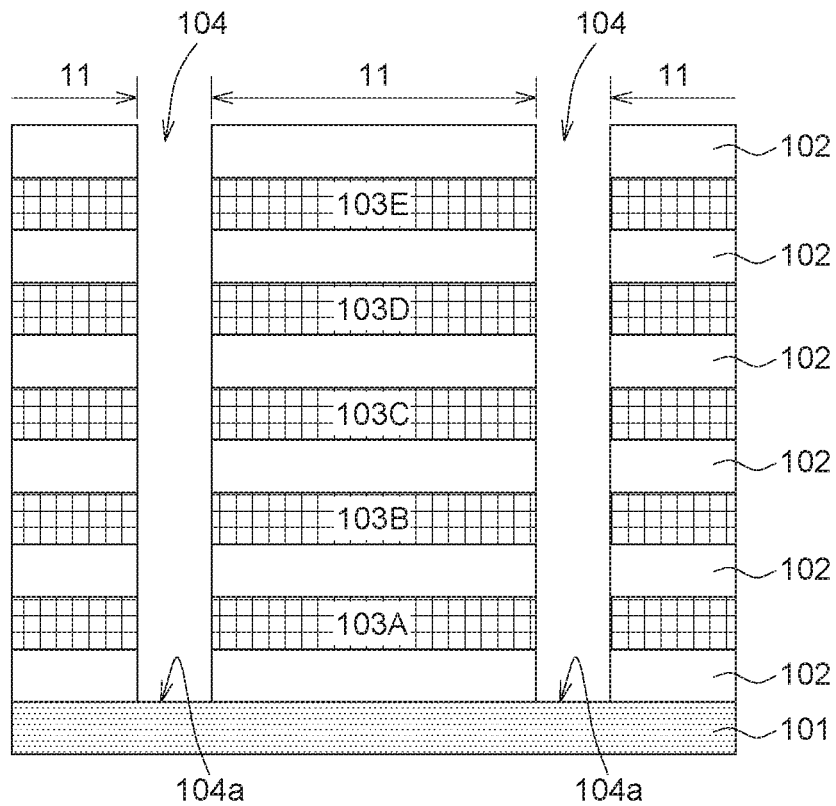

A memory device and the method for fabricating the same are provided to solve the variation problems of threshold voltages of the memory cells in a memory cell string due to the influence of the grain boundaries formed in the vertical channel layer of the memory device. A number of embodiments of the present disclosure are disclosed below with reference to accompanying drawings.

However, the structure and contents disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the invention will be able to make suitable modifications or changes based on the specification disclosed below to meet actual needs without breaching the spirit of the invention. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

FIGS. 1A to 1G are cross-sectional views illustrating the processing structures for fabricating a memory device 10, in accordance with one embodiment of the present disclosure. The method for fabricating the memory device 10 includes steps as follows: Firstly, at least one conductive strip stack structure 11 is formed on a substrate 101, wherein the forming of the conductive strip stack structure 11 includes steps of providing a plurality of conductive layers 103 and a plurality of insulating layers 102 stacked in a staggered manner with the conductive layers 103 (see FIG. 1A). In some embodiments of the present disclosure, the material used to constitute the conductive layers 103 may be a doped or undoped semiconductor material, such as a semiconductor material selected from a group consisting of silicon (Si), germanium (Ge), silicon germanium (SiGe), silicon carbide (SiC), TiN, TaN, W, Pt and the arbitrary combinations thereof. The insulating layers 102 may be made of SiOx, SiN, SiON, SiCO or any other suitable dielectric materials.

Next, a plurality of channel openings 104 passing through the conductive layers 103 and the insulating layers 102 are formed by a patterning process, such as an etch process, to expose a portion of the substrate 101 and to form a plurality of the conductive strip stack structure 11 on the substrate 101 (see FIG. 1B), In some embodiments of the present disclosure, each of the channel openings 104 can be a trench or a hole. In the present embodiment, each of the channel openings 104 can be a hole passing through the conductive layers 103 and the insulating layers 102 used to expose a portion of the substrate 101 and to divide the conductive layers 103 and the insulating layers 102 into at least two conductive strip stack structure 11.

Each of the conductive strip stack structure 11 includes a plurality of conductive strips, such as the conductive strips 103A, 103B, 103C, 103D and 103E, stacked in a staggered manner with the insulating layers 102. The conductive strips 103B, 103C and 103D that are disposed on the middle levels of the conductive strip stack structure 11 may be configured to serve as the word lines (WLs) of the memory device 10; at least one of the conductive strips (such as the conductive strip 103A) that is disposed on the bottom levels of the conductive strip stack structure 11 may be configured to serve as the ground selection line (GSL) or the reference selection line of the memory device 10; and at least one of the conductive strips (such as the conductive strip 103E) that is disposed on the upper levels of the conductive strip stack structure 11 may be configured to serve as the string selection line (SSL) of the memory device 10.

Figure 1C:
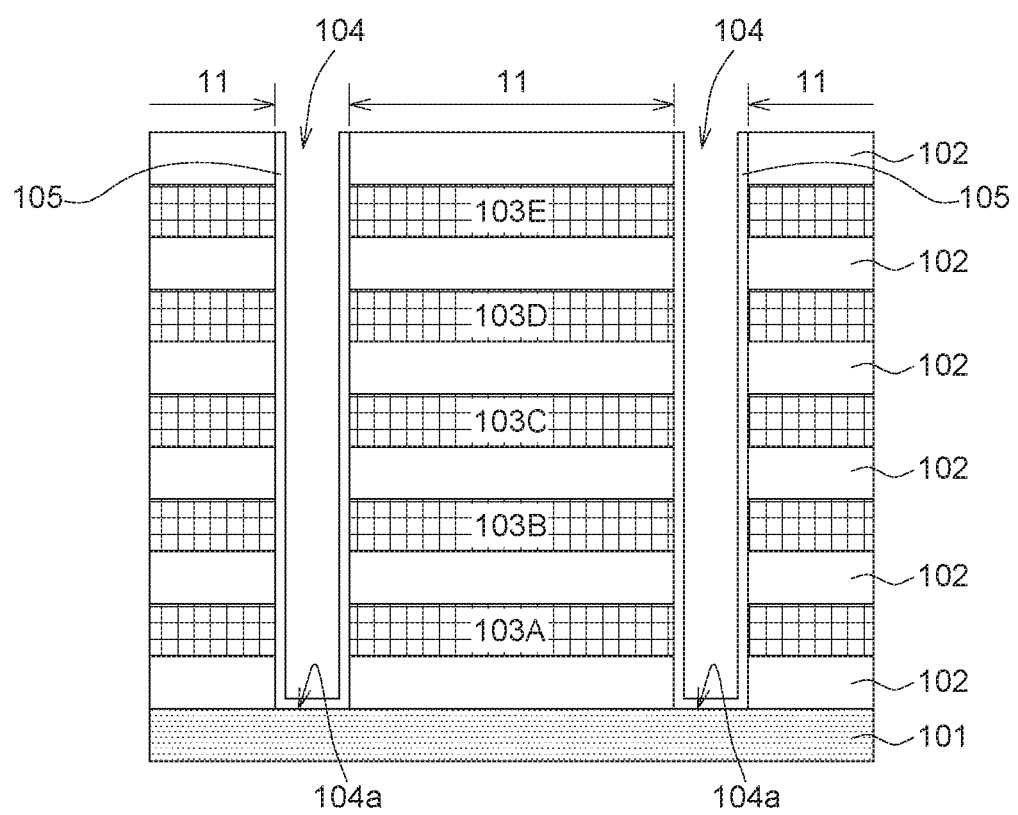
Figure 1D:
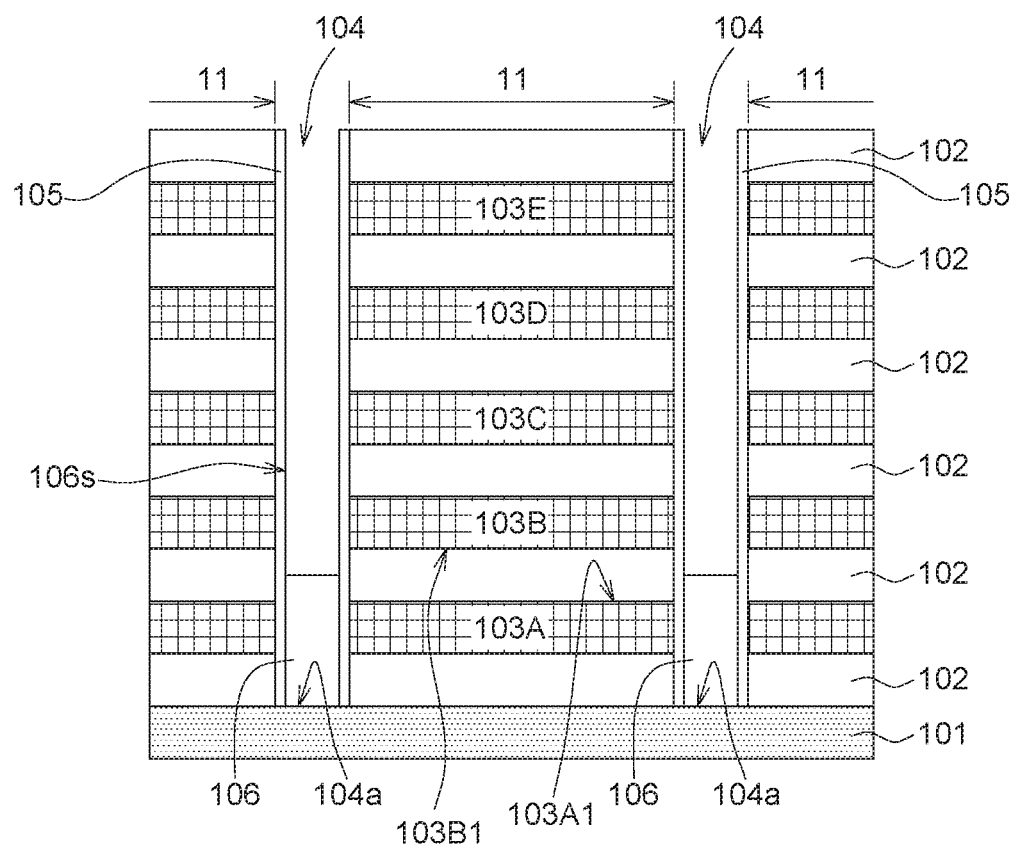

A memory layer 105 is then formed in the channel openings 104 to overly the portions of the sidewalls of the insulating layers 102 and the conductive strips 103A, 103B, 103C, 103D and 103E exposed from the channel openings 104, wherein the memory layer 105 is in contact with the bottoms 104a of the channel openings 104 (see FIG. 1C). The memory layer 105 may include a multilayer dielectric charge trapping structure as known from flash memory technologies. For example, in some embodiments of the present disclosure, the memory layer 105 may include an ONO (oxide-nitride-oxide) structure, an ONONO (oxide-nitride-oxide-nitride-oxide) structure, a SONOS (silicon-oxide-nitride-oxide-silicon) structure, a BE-SONOS (band-gap engineered silicon-oxide-nitride-oxide-silicon) structure, a TANOS (tantalum nitride, aluminum oxide, silicon nitride, silicon oxide, silicon) structure, or a MA BE-SONOS (metal-high-k bandgap-engineered silicon-oxide-nitride-oxide-silicon) structure.

Thereinafter, a portion of the memory layer 105 is removed to expose the bottom 104a of the channel opening 104, and a semiconductor pad 106 is then formed in a manner of extending upwards from the bottom 104a of the channel opening 104 beyond the upper surface 103A1 of a bottom conductive strip 103A, whereby the conductive strips 103A, 103B, 1030, 103D and 103E can be insulated from the semiconductor pad 106 by the remaining memory layer 105. In some embodiments of the present disclosure, the semiconductor pad 106 may be a semiconductor structure formed by a deposition process, such as a self-aligned selective epitaxial growth, at the bottom 104a of the channel opening 104. The material used to constitute the semiconductor pad 106 can be Si, Ge, SiGe, gallium arsenide (GaAs), SiC or any other suitable semiconductor materials. In the present embodiment, the semiconductor pad 106 can include poly-silicon. The top surface 106a of the semiconductor pad 106 is located between the upper surface 103A1 of the bottom conductive strip 103A and the lower surface 103B1 of the next highest conductive strip 103B in the bottom levels. There is no other conductive strip between the upper surface 103A1 of the bottom conductive strip 103A and the lower surface 103B1 of the conductive strip 103B. However, in another embodiment of the present disclosure, the top surface 106a of the semiconductor pad 106 may extend upward beyond other conductive strips (not shown).

Figure 1E:
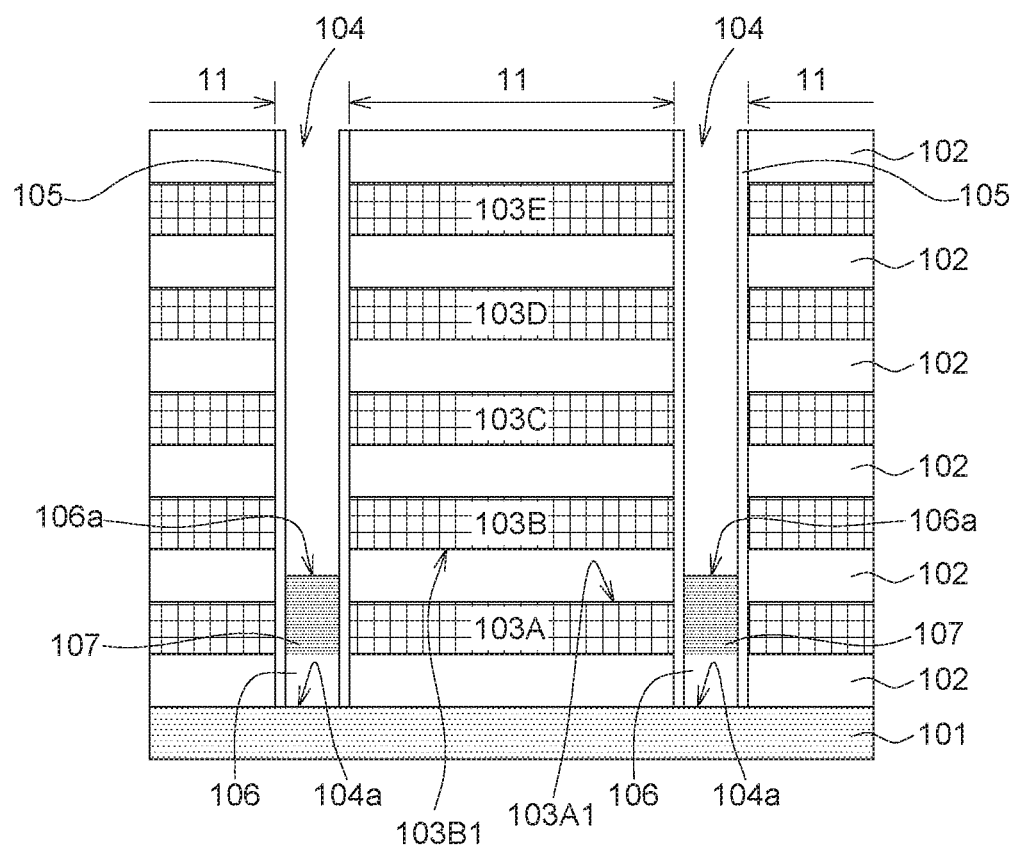
Figure 1F:
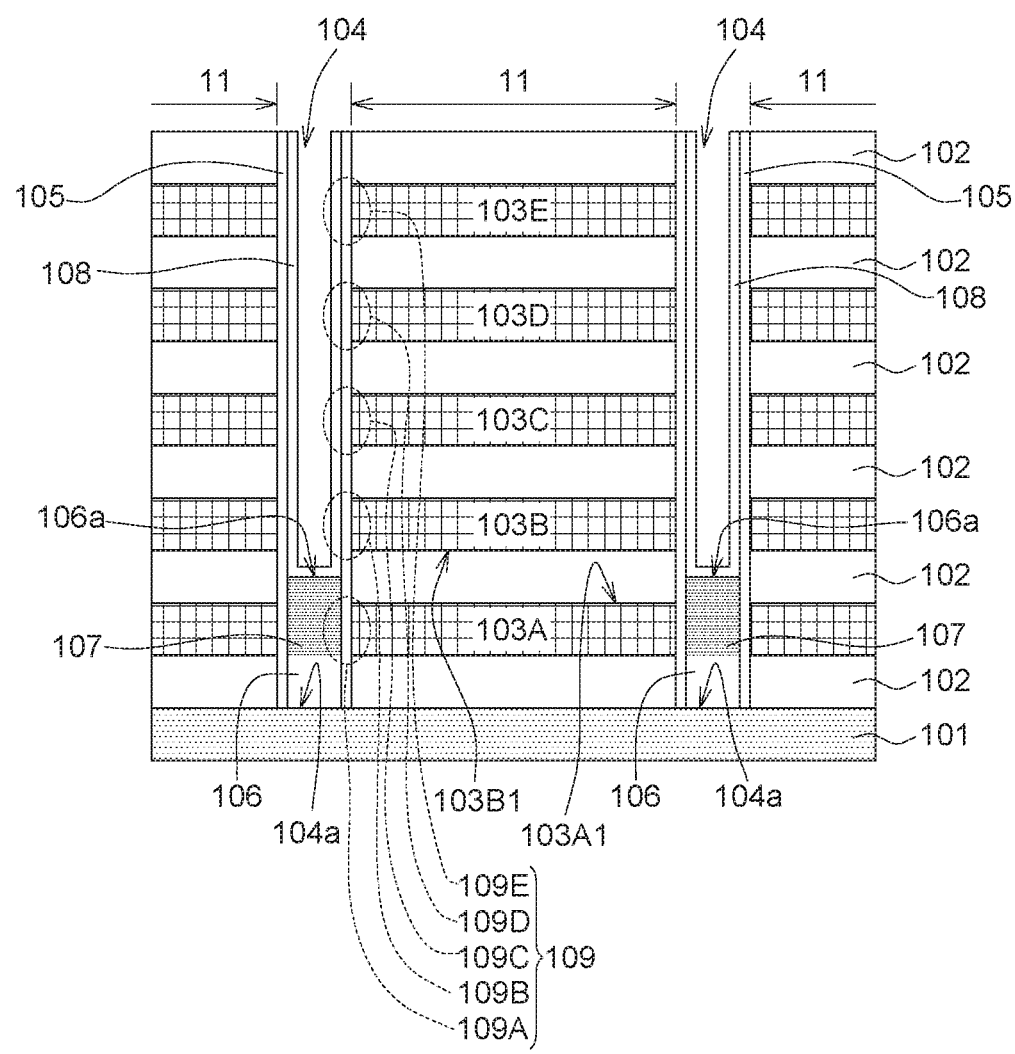

The semiconductor pad 106 is then subjected to an ion implantation process for implanting a plurality of base dopants 107 having a predetermined doping concentration into the semiconductor pad 106 (as shown in FIG. 1E). In some embodiments of the present disclosure, the base dopant 107 can be a p-type dopant, such as boron (B), or can be an n-type dopant, such as phosphorus (P) or arsenic (As). In the present embodiment, the base dopant 107 can be an n-type dopant.

A channel layer 108 is formed in the channel opening 104 to cover the memory layer 105 and the top surface 106a of the semiconductor pad 106, so as to make the channel layer 108 in contact with the semiconductor pad 106. As a result, a plurality of charge trapping thin film transistor switches are respectively formed on the intersections of the conductive strips 103A, 103B, 103C, 103D and 103E with the memory layer 105, the channel layer 108, and the semiconductor pad 106. Meanwhile, the charge trapping thin film transistor switches can be connected in series by the channel layers 108 to form a memory cell string 109 (see FIG. 1F).

For example, in the present embodiment, the charge trapping thin film transistor switch 109A that is formed at the intersection of the conductive strip 103A, the memory layer 105, and the semiconductor pad 106, and is electrically connected to the substrate 101 through the semiconductor pad 106 can be used as a ground selection switch for memory cell string 109. The plurality of charge trapping thin film transistor switches 109B, 109C and 109D that are formed at the intersections of the conductive strips 103B, 103C, and 103D, overlapping the memory layer 105 and the channel layer 108 can be used as a plurality of the memory cells of the memory cell string 109. The charge trapping thin film transistor switch 109E that is formed at the intersection of the conductive strip 103E, the memory layer 105, and the channel layer 108 can be used as a string selection switch for memory cell string 109.

The material constituting the channel layer 108 may be the same as or different from the material constituting the semiconductor pad 106. In some embodiments of the present disclosure, the material constituting the channel layer 108 may include a semiconductor material such as Si, Ge, SiGe, GaAs, SiC or other semiconductor materials. In the present embodiment, the channel layer 108 includes poly-silicon.

Figure 1G:
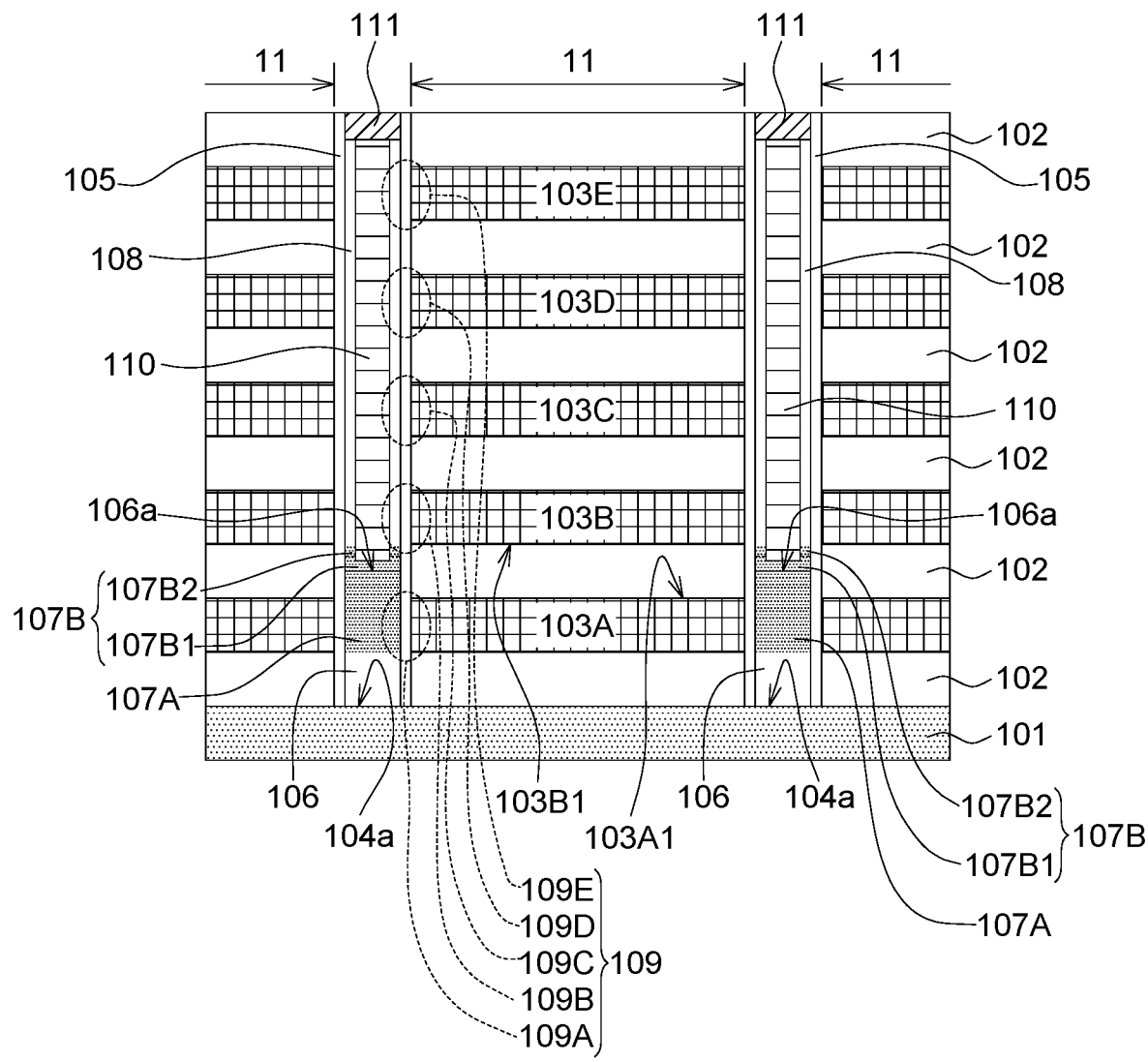

Thereafter, the channel opening 104 is filled by a dielectric material 110, and after the dielectric material 110 is planarized, an etch back process is performed to remove a portion of the dielectric material 110 and form a plurality of recesses (not shown) aligning the channel opening 104. A conductive material is then filled in the recesses (not shown), and a plurality of contact pads 111 for connecting the channel layer 108 to the bit lines (not shown) are formed. Subsequently, a series of back-end processes (not shown) are performed to form the memory component 10 as shown in FIG. 1G.

In some embodiments of the present specification, since the back-end process includes a plurality of thermal processes, a portion of the base dopant 107B may be driven from the doped semiconductor pad 106 into the channel layer 108. Such that the portion of the base dopant 107B that are driven into the channel layer 108 may has a dopant concentration substantially less than the concentration of the remaining portion of the base dopant 107A located in semiconductor pad 106. The portion of the base dopant 107B that are driven into the channel layer 108 may be divided into at least two portions, such as a first portion 107B1 having a first doping concentration and a second portion 107B2 having a second doping concentration disposed on the first portion 107B1, wherein the first doping concentration is greater than the second doping concentration. The first doping concentration has a concentration gradient that decreases along the direction from the top surface 106a of the semiconductor pad 106 away from the bottom 104a of the channel opening 104; and the second doping concentration has a concentration gradient that decreases along the direction from the first portion 107B1 away from the bottom 104a of the channel opening 104.

In the present embodiment, there is no obvious boundary between the first portion 107B1 and the second portion 107B2 of the portion of the base dopant 107B that are driven into the channel layer 108. Such that, the portion of the base dopant 107B, as a whole, has a concentration gradient that decreases along the direction from the top surface 106a of the semiconductor pad 106 away from the bottom 104a of the channel opening 104. The portion of the base dopant 107B located in the channel layer 108 (the height of the second portion 107B2) may not extend upwards beyond the lower surface 103B1 of the next highest conductive strip 103B.

By driving a portion of the dopant 107B into the channel layer 108, the grain boundary barrier and channel resistance in the channel layer 108 can be reduced, and channel current of the memory cell string 109 can be increased when being operated at a constant operating voltage, whereby relatively stable threshold voltages can be provided to the thin film transistor switches 109A, 109B, 109C, 109D and 109E in the memory cell string 109. As result, the conventional problems of unstable operation due to a grain boundary generated in the non-gate control region of the vertical channel layer 108 can be solved.

FIGS. 2A to 2G are cross-sectional views illustrating the processing structures for fabricating a memory device 20, in accordance with another embodiment of the present disclosure. The method for fabricating the memory device 20 includes steps as follows: Firstly, at least one sacrificial strip stack 21 is formed on a substrate 201, wherein the forming of the sacrificial strip stack 21 includes steps of providing a plurality of sacrificial layers 213 and a plurality of insulating layers 202 stacked in a staggered manner with the sacrificial layers 213 (see FIG. 2A). In some embodiments of the present disclosure, the material used to constitute the sacrificial layers 213 may be different from the material used to constitute the insulating layers 202. For example, in the present embodiment, the material used to constitute the sacrificial layers 213 can be silicon nitride (SiN); and the material used to constitute the insulating layers 202 can be $SiO_2$.

Figure 2A:
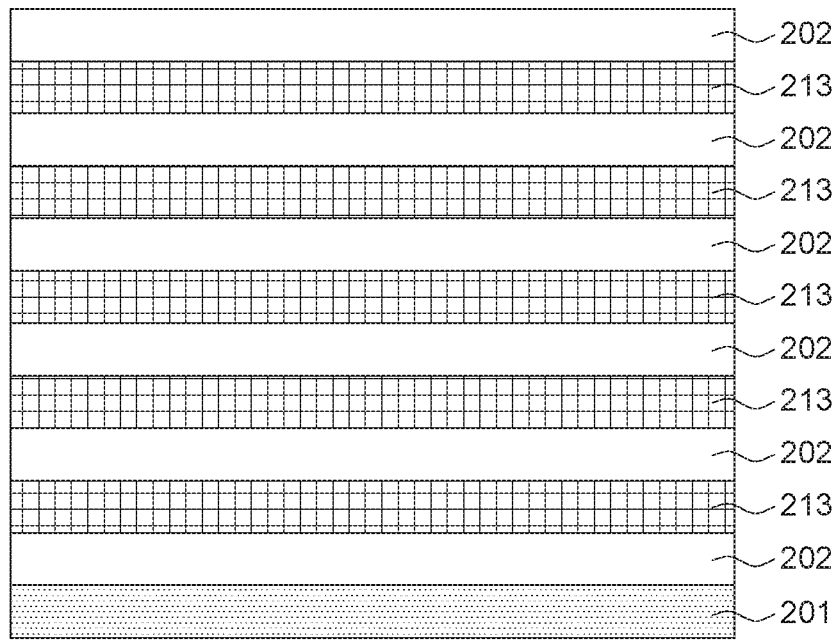
FIGS. 2A to 2G are cross-sectional views illustrating the processing structures for fabricating a memory device, in accordance with another embodiment of the present disclosure.
Figure 2B:
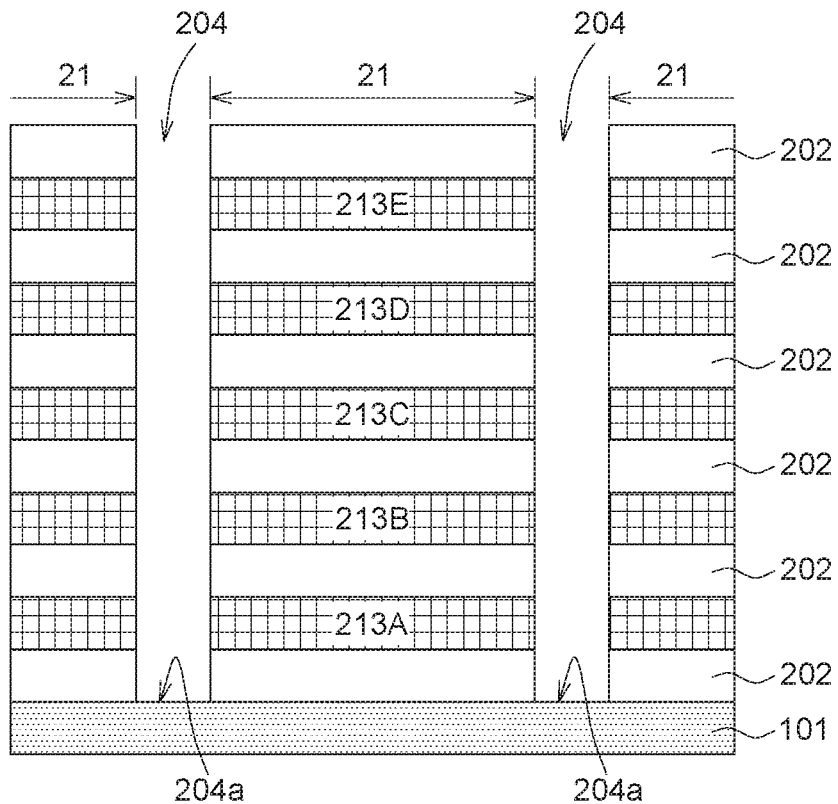

Next, a plurality of channel openings 204 passing through the sacrificial layers 213 and the insulating layers 202 are formed by a patterning process, such as an etch process, to expose a portion of the substrate 201 and to form a plurality of the sacrificial strip stack structure 21 on the substrate 201 (see FIG. 2B). In some embodiments of the present disclosure, each of the channel openings 204 can be a trench or a hole. In the present embodiment, each of the channel openings 204 can be a hole passing through the sacrificial layers 213 and the insulating layers 202 used to expose a portion of the substrate 201 and to divide the sacrificial layers 213 and the insulating layers 202 into at least two sacrificial strip stack structure 21, Each of the sacrificial strip stack structure 21 includes a plurality of sacrificial strips, such as the sacrificial strips 213A, 213B, 213C, 213D and 213E, stacked in a staggered manner with the insulating layers 202.

Figure 2C:
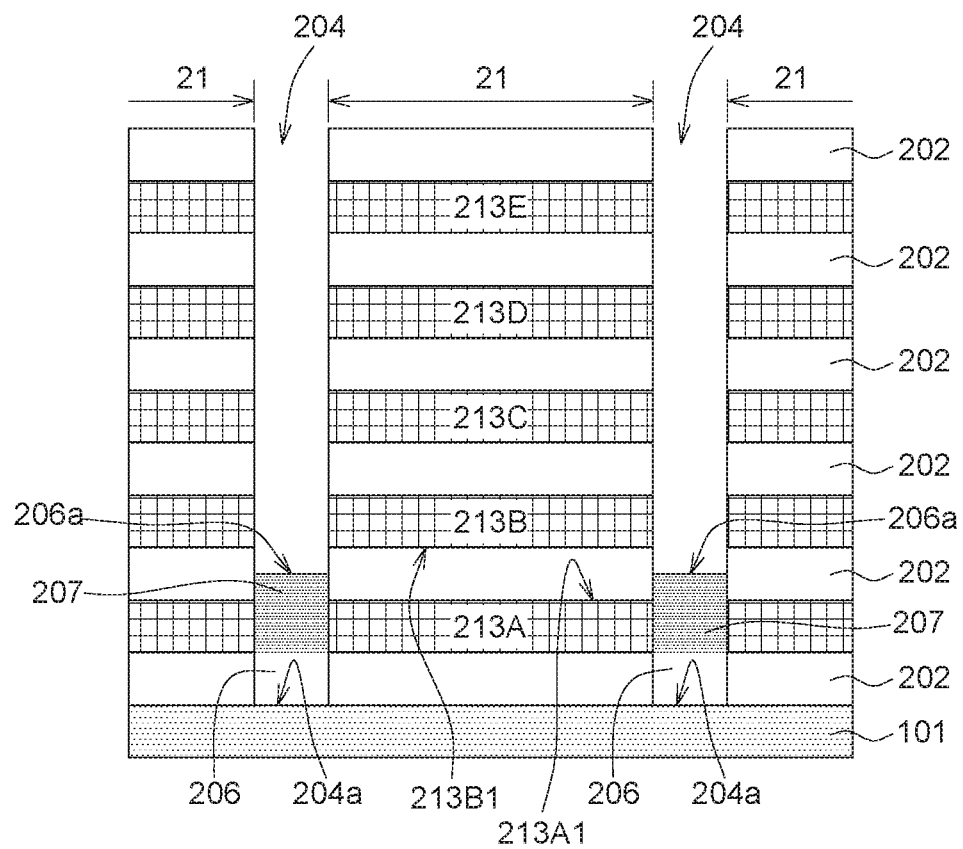
Figure 2D:
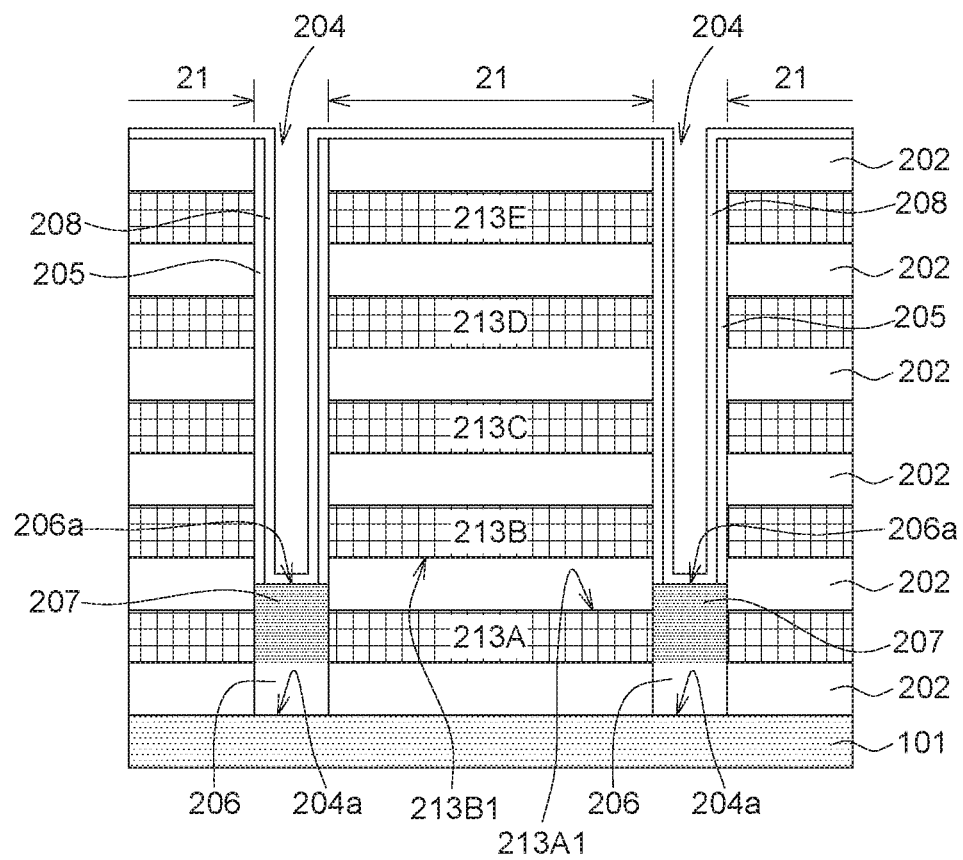
Figure 2E:
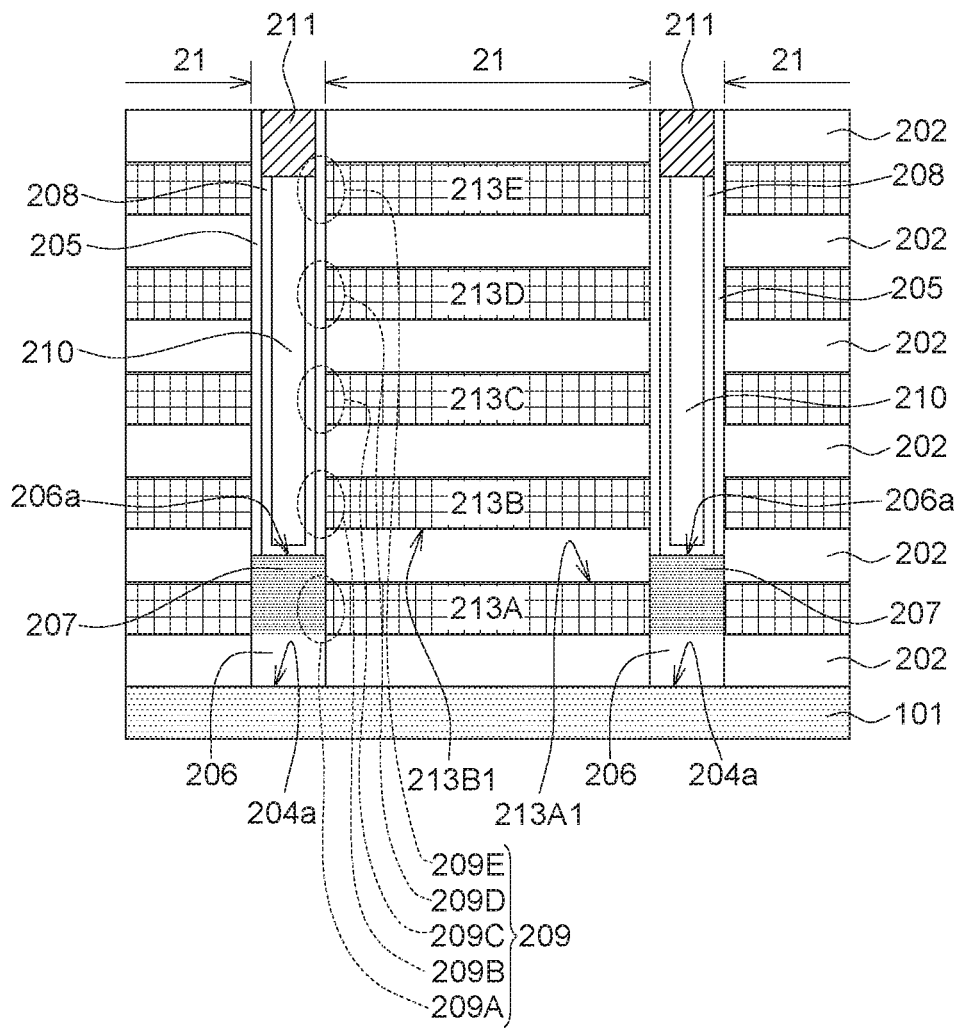
Figure 2F:
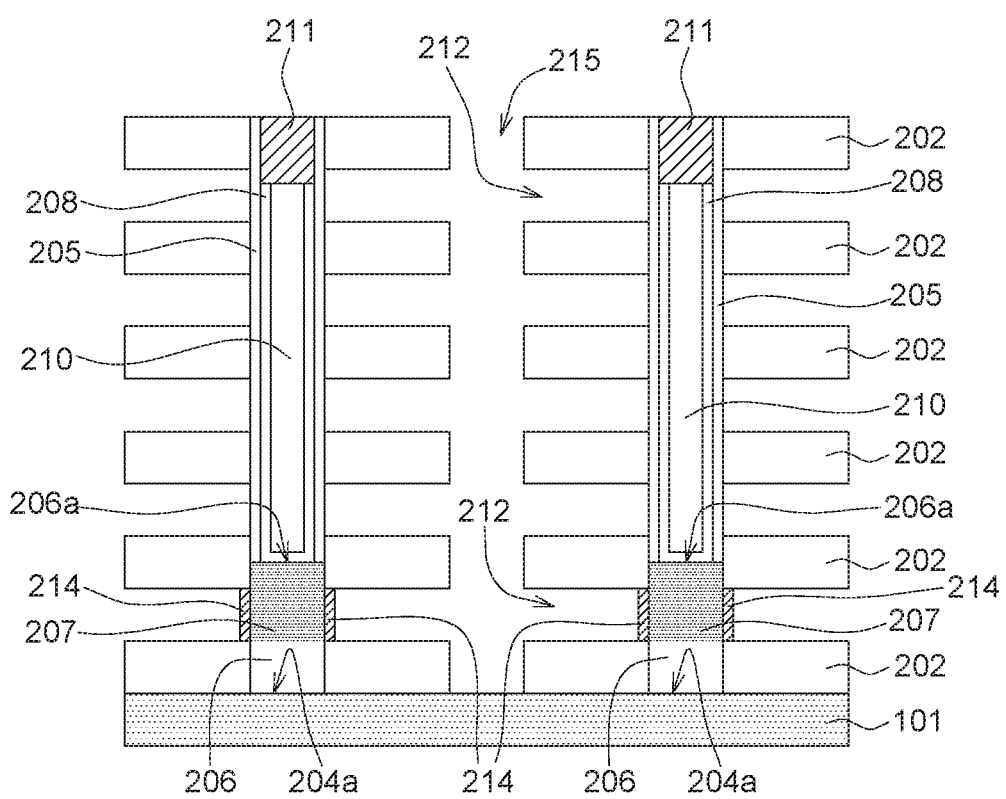

A semiconductor pad 206 is then formed in a manner of extending upwards from the bottom 204a of the channel opening 204 beyond the upper surface 213A1 of a bottom sacrificial strip 213A (see FIG. 2C). In some embodiments of the present disclosure, the semiconductor pad 206 may be a semiconductor structure formed by a deposition process, such as a self-aligned selective epitaxial growth, at the bottom 204a of the channel opening 204. The material used to constitute the semiconductor pad 206 can be Si, Ge, SiGe, GaAs, SiC or any other suitable semiconductor materials. In the present embodiment, the semiconductor pad 206 can include poly-silicon. The top surface 206a of the semiconductor pad 206 is located between the upper surface 213A1 of the bottom sacrificial strip 213A and the lower surface 213B1 of the next highest sacrificial strip 213B.

The semiconductor pad 206 is then subjected to an ion implantation process for implanting a plurality of base dopants 207 having a predetermined doping concentration into the semiconductor pad 206 (also refer to FIG. 2C). In some embodiments of the present disclosure, the base dopant 207 can be a p-type dopant, such as B, or can be an n-type dopant, such as P or As. In the present embodiment, the base dopant 207 can be an n-type dopant, and the predetermined doping concentration has a concentration gradient that decreases along a direction from the top surface 206a of the semiconductor pad 206 towards the bottom 204a of the channel opening 204.

A memory layer 205 is then formed in the channel openings 204 to overly the portions of the sidewalls of the insulating layers 202 and the sacrificial strips 213B, 213C, 213D and 213E exposed from the channel openings 204. Thereinafter, a portion of the memory layer 205 is removed to expose the top surface 206a of the semiconductor pad 206, and a channel layer 208 is then formed in the channel opening 204 to cover the memory layer 205 and the top surface 206a of the semiconductor pad 206, so as to make the channel layer 208 in contact with the semiconductor pad 206 (see FIG. 2D).

In some embodiments of the present disclosure, the memory layer 205 may include a multilayer dielectric charge trapping structure as known from flash memory technologies. For example, in some embodiments of the present disclosure, the memory layer 205 may include an ONO structure, an ONONO structure, a SONOS structure, a BE-SONOS structure, a TANOS structure, or a MA BE-SONOS structure. The channel layer 208 can be a poly-silicon film. The material constituting the channel layer 208 may include a semiconductor material such as Si, Ge, SiGe, GaAs, SiC or other semiconductor materials. In the present embodiment, the memory layer 205 may include an ONO structure; and the channel layer 108 includes poly-silicon.

Next, the channel opening 204 is filled by a dielectric material 210, and after the dielectric material 210 is planarized, an etch back process is performed to remove a portion of the dielectric material 210 and to form a plurality of recesses (not shown) aligning the channel opening 204. A conductive material is then filled in the recesses (not shown), and a plurality of contact pads 211 for connecting the channel layer 208 to the bit lines (not shown) are formed (see FIG. 2E).

Then, the sacrificial strips 213A, 213B, 213C, 213D, and 213E in the sacrificial strip stack structure 21 are selectively removed to form a plurality of voids 212 between the insulating layers 202 for exposing a portion of the memory layer 205 and the sidewalls 206b of the semiconductor pad 206. A dielectric liner 214 is formed in the void 212 to at least cover the sidewalls 206b of the semiconductor pad 206 exposed from the voids 212 (see FIG. 2F).

In some embodiments of the present disclosure, a plurality of trenches 215 may be formed in the sacrificial strip stack structure 21 passing through the sacrificial strips 213A, 213B, 213C, 213D, and 213E and the insulating layer 202, and these sacrificial strips 213A, 213B, 213C, 213D, and 213E are then removed through the trench 215 by a selectively etched. For example, in the present embodiment, an etch chemistry having a characteristic relatively easy to etch of SiN (such as phosphoric acid (H3PO4)), is selected to remove the sacrificial strips 213A, 213B, 213C, 213D, and 213E. In some embodiments of the present specification, the dielectric liner 214 is formed by a thermal oxidation process of the sidewall 206b of the semiconductor pad 206.

Figure 2G:
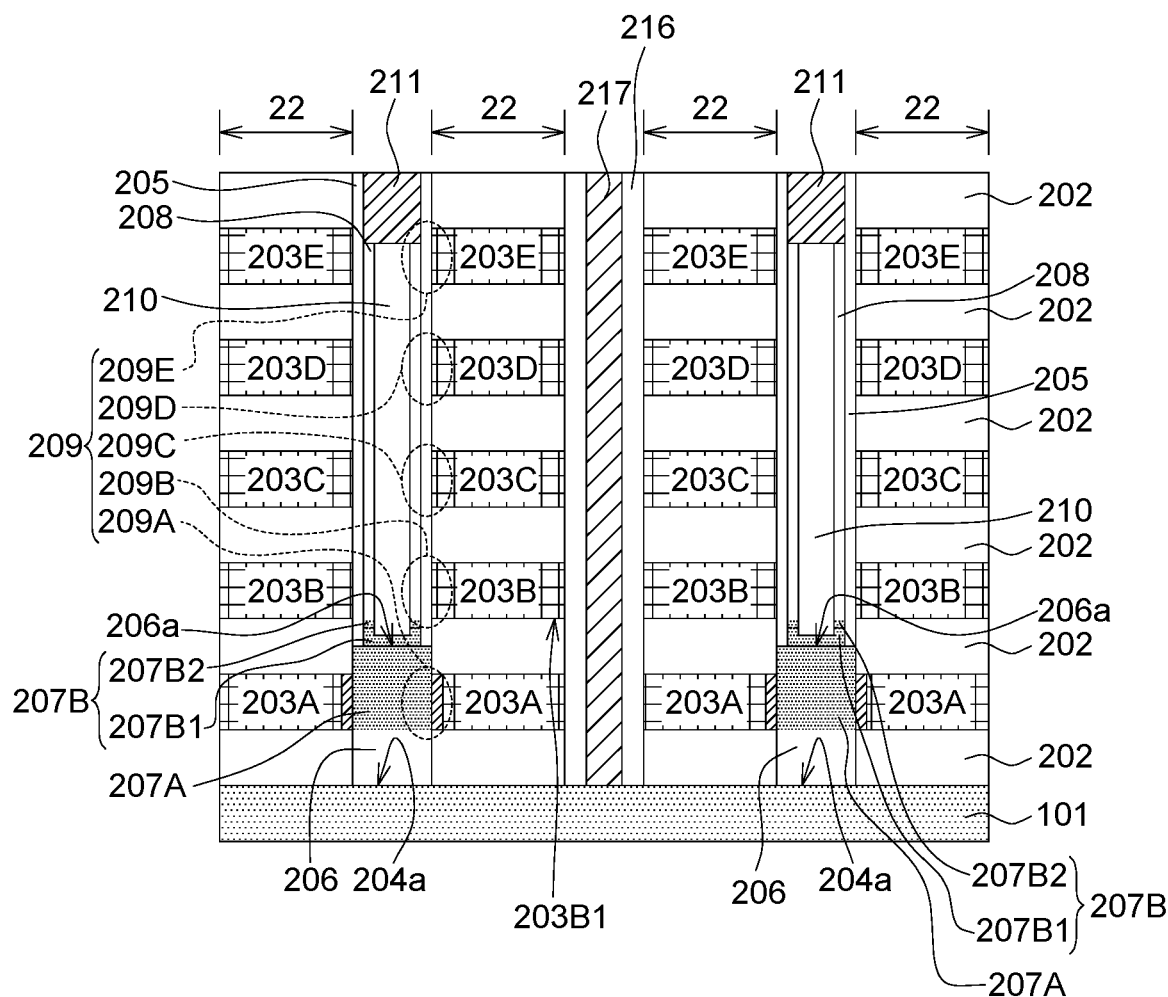

Thereafter, the voids 212 are filled with a conductive material, thereby a plurality of conductive strips 203A, 203B, 203C, 203D, and 203E can be formed between the insulating layers 202, so as to convert the original sacrificial strip stack structures 21 into a plurality of conductive strip stack structures 22 (see FIG. 2G). The conductive strips 203B, 203C and 203D that are disposed on the meddle levels of the conductive strip stack structure 22 may be configured to serve as the word lines (WLs) of the memory device 20; at least one of the conductive strips (such as the conductive strip 203A) that is disposed on the bottom levels of the conductive strip stack structure 21 may be configured to serve as the ground selection line (GSL) or the reference selection line of the memory device 20; and at least one of the conductive strips (such as the conductive strip 203E) that is disposed on the upper levels of the conductive strip stack structure 21 may be configured to serve as the string selection line (SSL) of the memory device 20. A plurality of charge trapping thin film transistor switches are respectively formed on the intersections of the conductive strips 203A, 203B, 203C, 203D, and 203E with the memory layer 205, the channel layer 208, and the semiconductor pad 206. Meanwhile, the charge trapping thin film transistor switches can be connected in series by the channel layers 208 to form a memory cell string 209.

For example, in the present embodiment, the charge trapping thin film transistor switch 209A that is formed at the intersection of the conductive strip 203A, the memory layer 205, and the semiconductor pad 206, and is electrically connected to the substrate 201 through the semiconductor pad 206 can be used as a ground selection switch for memory cell string 209. The plurality of charge trapping thin film transistor switches 209B, 209C and 209D that are formed at the intersections of the conductive strips 203B, 203C, and 203D, overlapping the memory layer 205 and the channel layer 208 can be used as a plurality of the memory cells of the memory cell string 209. The charge trapping thin film transistor switch 209E that is formed at the intersection of the conductive strip 203E, the memory layer 205, and the channel layer 208 can be used as a string selection switch for memory cell string 109.

Subsequently, a spacer 216 and a source line 217 are formed in the trench 215, and thereafter a series of back-end processes (not shown) are performed to form the memory element 20 as depicted in FIG. 2G. In some embodiments of the present specification, since the back-end process includes a plurality of thermal processes, a portion of the dopant 207B may be driven from the semiconductor pad 206 into the channel layer 208. Such that the portion of the dopant 207B located in the channel layer 208 may have a dopant concentration substantially less than the concentration of the remaining portion of the dopant 207A located in semiconductor pad 206. The portion of the base dopant 207B that are driven into the channel layer 108 may be divided into at least two portions, such as a first portion 207B1 having a first doping concentration and a second portion 207B2 having a second doping concentration disposed on the first portion 207B1, wherein the first doping concentration is greater than the second doping concentration. The first doping concentration has a concentration gradient that decreases along the direction from the top surface 206a of the semiconductor pad 206 away from the bottom 204a of the channel opening 204; and the second doping concentration has a concentration gradient that decreases along the direction from the first portion 207B1 away from the bottom 204a of the channel opening 204.

In the present embodiment, there is no obvious boundary between the first portion 107B1 and the second portion 10732 of the portion of the base dopant 207B that are driven into the channel layer 208. Such that, the portion of the base dopant 207B, as a whole, has a concentration gradient that decreases along the direction from the top surface 206a of the semiconductor pad 206 away from the bottom 204a of the channel opening 204. The portion of the base dopant 207B located in the channel layer 208 (the height of the second portion 20732) may not extend upwards beyond the lower surface 20331 of the next highest conductive strip 203B.

By driving a portion of the base dopant 207B into the channel layer 208, the grain boundary barrier and channel resistance in the channel layer 208 can be reduced; and channel current of the memory cell string 209 can be increased when being operated at a constant operating voltage, whereby relatively stable threshold voltages can be provided to the thin film transistor switches 209A, 209B, 209C, 209D and 109E in the memory cell string 209. As result, the conventional problems of unstable operation due to a grain boundary generated in the non-gate control region of the vertical channel layer 108 can be solved.

According to the above embodiments, a memory device and a method of fabricating the same are provided, in which a semiconductor pad is formed on the bottom of a channel opening for forming a vertical memory cell string and in contact with the channel layer of the vertical memory cell string subsequently formed on the sidewall of the channel opening. Before forming the channel layer, a base dopant is implanted into the semiconductor pad by an ion implantation process, and a part of the dopant in the semiconductor pad is driven into the vertical channel layer by heat treatments of the subsequent process, thereby the resistance of the channel layer can be reduced, and a stable threshold voltage control can be provided for the vertical memory cell string. Such that, the conventional problem of unstable operation due to a grain boundary generated in the non-gate control region of the channel layer can be solved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device comprising:
a conductive strip stack structure, comprising a plurality of conductive strips and a plurality of insulating layers stacked in a staggered manner with the plurality of conductive strips, wherein the conductive strip stack structure has at least one channel opening passing through the plurality of conductive strips and the plurality of insulating layers;
a memory layer, disposed in the at least one channel opening and overlying portions of the plurality of conductive strips that are exposed from the at least one channel opening;
a channel layer, disposed in the at least one channel opening and overlying the memory layer; and
a doped semiconductor pad, extending upwards from a bottom of the at least one channel opening beyond an upper surface of a bottom conductive strip in the plurality of conductive strips, in contact with the channel layer, and electrically isolated from the plurality of conductive strips;
wherein, the channel layer comprises a first portion having a first doping concentration and a second portion having a second doping concentration disposed on the first portion, wherein the second doping concentration is less than the first doping concentration.

2. The memory device according to claim 1, wherein the first portion is disposed on a top surface of the doped semiconductor pad; the first doping concentration is greater than the second doping concentration; and the first doping concentration has a concentration gradient that decreases along a direction from the top surface of the semiconductor pad away from the bottom of the channel opening.

3. The memory device according to claim 2, wherein the second doping concentration has a concentration gradient that decreases along a direction from the first portion away from the bottom of the channel opening.

4. The memory device according to claim 3, wherein the top surface of the doped semiconductor pad is located between the upper surface of the bottom conductive strip and a lower surface of a next highest conductive strip.

5. The memory device according to claim 4, wherein the second portion does not extend upwards beyond the lower surface of the next highest conductive strip.

6. The memory device according to claim 1, wherein the memory layer comprises a multilayer dielectric charge trapping structure.

7. A method for fabricating a memory device comprising:
providing a conductive strip stack structure comprising a plurality of conductive strips and a plurality of insulating layers stacked in a staggered manner with the plurality of conductive strips, wherein the conductive strip stack structure has at least one channel opening passing through the plurality of conductive strips and the plurality of insulating layers;
forming a semiconductor pad extending upwards from a bottom of the at least one channel opening beyond an upper surface of a bottom conductive strip in the plurality of conductive strips, and electrically isolated from the plurality of conductive strips;
implanting a base dopant into the semiconductor pad;
forming a memory layer in the at least one channel opening and overlying portions of the plurality of conductive strips that are exposed from the at least one channel opening;
forming a channel layer in the at least one channel opening, overlying the memory layer and in contact with the semiconductor pad; and
driving a portion of the base dopant into the channel layer to make the channel layer comprising a first portion having a first doping concentration and a second portion having a second doping concentration, wherein the second doping concentration is less than the first doping concentration.

8. The method according to claim 7, wherein providing the conductive strip stack structure further comprises:
providing a plurality of sacrificial layers stacked in a staggered manner with the plurality of insulating layers;
forming the at least one channel opening passing through the plurality of sacrificial layers;
forming the semiconductor pad on the bottom of the at least one channel opening;
forming the memory layer in the at least one channel opening and overlying portions of the plurality of sacrificial strips that are exposed from the at least one channel opening;
forming the channel layer in the at least one channel opening, overlying the memory layer and in contact with the semiconductor pad;
selectively removing the plurality of sacrificial layers to form a plurality of voids between the plurality of insulating layers for exposing a portion of the memory layer and sidewalls of the semiconductor pad;

forming at least one dielectric liner in the plurality of void to at least cover the sidewalls of the semiconductor pad exposed from the plurality of voids; and filling the plurality of voids with a conductive material to form the plurality of conductive strips between the plurality of insulating layers.

9. The method according to claim 7, after forming the conductive strip stack structure further comprising:

forming the memory layer in the at least one channel opening, wherein the memory layer is in contact with the bottom of the at least one channel opening;

removing a portion of the memory layer to expose the bottom of the at least one channel opening;

forming the semiconductor pad; and forming the channel layer overlying the memory layer and a top surface of the semiconductor pad.

10. The method according to claim 7, further comprising:

filling the at least one channel opening with a dielectric material; and forming at least one contact pad aligned with the at least one channel opening and connecting to the channel layer.

* * * * *